United States Patent
Balzano et al.

(10) Patent No.: US 12,237,033 B2
(45) Date of Patent: Feb. 25, 2025

(54) COMPONENT OVERPROVISIONING IN LAYERED DEVICES

(71) Applicant: Micron Technology, Inc., Boise, ID (US)

(72) Inventors: Domenico Balzano, Torre Annunziata (IT); Enrico Camillo Beretta, Sengkang (SG)

(73) Assignee: Micron Technology, Inc., Boise, ID (US)

( * ) Notice: Subject to any disclaimer, the term of this patent is extended or adjusted under 35 U.S.C. 154(b) by 358 days.

(21) Appl. No.: 17/664,342

(22) Filed: May 20, 2022

(65) Prior Publication Data
US 2023/0377674 A1 Nov. 23, 2023

(51) Int. Cl.
*G11C 29/44* (2006.01)
*G11C 29/52* (2006.01)

(52) U.S. Cl.
CPC .............. *G11C 29/44* (2013.01); *G11C 29/52* (2013.01)

(58) Field of Classification Search
CPC ....... G11C 29/00; G11C 29/70; G11C 29/846; G11C 29/835; G11C 29/8081; G11C 29/802; G11C 29/785; G11C 29/781; G11C 29/24; G11C 29/5244; G11C 2229/72; G11C 2229/723; G11C 2229/726
USPC ............................................ 365/23
See application file for complete search history.

(56) References Cited

U.S. PATENT DOCUMENTS

| | | | |
|---|---|---|---|
| 2017/0148529 A1* | 5/2017 | Kim | G11C 29/76 |
| 2022/0208296 A1* | 6/2022 | Seok | G11C 29/76 |
| 2022/0319628 A1* | 10/2022 | Chen | G11C 29/886 |

* cited by examiner

*Primary Examiner* — Sung Il Cho
(74) *Attorney, Agent, or Firm* — Harrity & Harrity, LLP

(57) ABSTRACT

Implementations described herein relate component overprovisioning in layered devices. In some implementations, a test device may include one or more components configured to perform, on a set of memory components of a memory device, a set of production tests. The one or more components may be configured to identify, based on the set of production tests, a failure of a memory component of the memory device. The one or more components may be configured to reconfigure the memory device to downsize the memory device from a first configuration associated with the set of memory components to a second configuration associated with a first subset of the set of memory components.

25 Claims, 7 Drawing Sheets

COMPONENT OVERPROVISIONING IN LAYERED DEVICES

TECHNICAL FIELD

The present disclosure generally relates to layered devices, such as memory devices, to layered device operations, such as memory device operations, and, for example, to component overprovisioning in layered devices.

BACKGROUND

Some electronic devices may have multiple layers to increase a density of components included in a package of an electronic device. For example, a three-dimensional (3D) NAND device or vertical NAND device may include multiple memory chips stacked on top of each other to increase a data storage capacity without increasing a size of a wafer and an associated device footprint. Some 3D NAND devices may include 32 layers, 48 layers, 64 layers, 96 layers, or more. Such layered devices can be configured with firmware to enable efficient utilization of a whole capacity. For example, a 3D NAND device may include firmware to enable memory operations to be performed on each memory component corresponding to each layer. Other types of layered devices may include other types of memory devices (e.g., NOR devices), other types of processing devices, or other types of electrical or optical devices, among other examples.

DETAILED DESCRIPTION

A layered device includes a stack of a set of components in a vertical direction to increase a density of components without increasing a footprint of the layered device relative to a single-layer device. For example, for a given wafer size, a memory device with two layers may achieve twice a memory density as is achieved by a one layer memory device. Accordingly, memory devices have increasing quantities of layers of memory components to achieve increasing memory densities without requiring larger wafers and associated footprints.

Production testing of electronic devices, such as layered devices, may be used to identify potential failures in electronic devices before the electronic devices are shipped to customers. For example, production testing may be performed to identify memory cells, in a memory component (e.g., a layer of a memory device), that are unusable as a result of being stuck in a particular logic state or not meeting a timing specification, among other examples. When the quantity of unusable memory cells, for example, is less than a threshold, redundant memory cells in the memory component may be used as replacements for the unusable memory cells. However, when the quantity of unusable memory cells is not less than the threshold, there may not be a sufficient quantity of redundant memory cells that can replace the unusable memory cells. In this case the memory component may fail.

However, each memory component is associated with a likelihood of failing one or more production tests that are performed on the memory device prior to the memory device being shipped to customers. Accordingly, as a quantity of memory components in a memory device increases, so too does a likelihood that the whole memory device fails a production test as a result of a memory component failing the production test. As a result, many memory devices may be discarded as a result of failures of a single memory component during production testing. As shortages of chips and associated memory devices increases, such wastage of memory devices results in an increasingly serious issue.

Some implementations described herein enable component overprovisioning in layered devices. For example, rather than fail a whole memory device when a memory component fails a production test, the memory device may be reconfigured from a first configuration to a second, downsized configuration. In this case, the failed memory component is deactivated within firmware of the memory device to isolate the failed memory component and prevent memory operations from being performed on the failed memory component, which can cause performance errors. Additionally, or alternatively, one or more other memory components, which did not fail the production test, may be deactivated to downsize the memory device to the second configuration.

Figure 1:
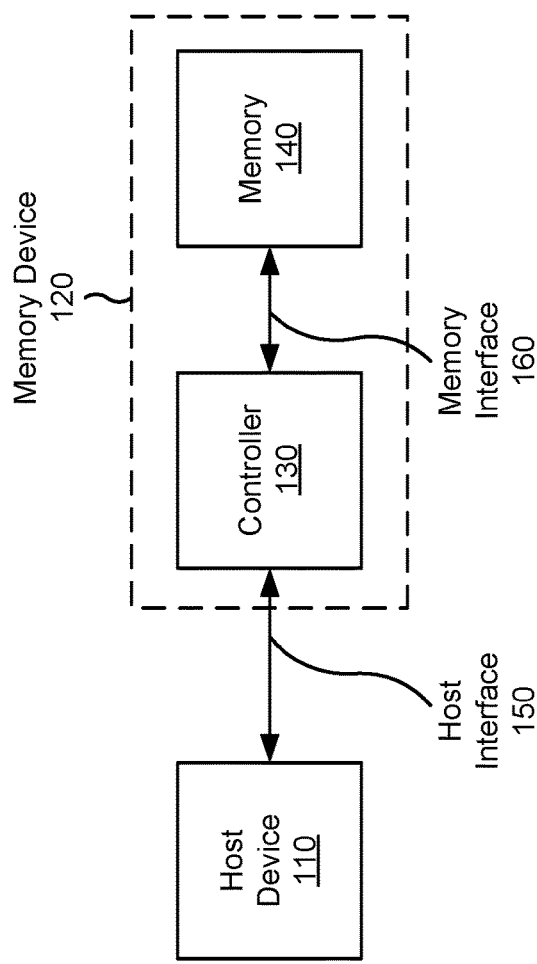
FIG. 1 is a diagram illustrating an example system capable of including an overprovisioned layered device.

FIG. 1 is a diagram illustrating an example system 100 capable of including an overprovisioned layered device. The system 100 may include one or more devices, apparatuses, and/or components for performing operations described herein (e.g., for component overprovisioning). For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, and/or an embedded multimedia card (eMMC) device.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components.

In some implementations, the memory 140 may include non-volatile memory configured to maintain stored data after the memory device 120 is powered off. For example, the memory 140 may include a layered NAND memory or a layered NOR memory. Additionally, or alternatively, the memory 140 may include volatile memory that requires power to maintain stored data and that loses stored data after the memory device 120 is powered off. For example, the memory 140 may include one or more latches and/or random-access memory (RAM), such as dynamic RAM (DRAM) and/or static RAM (SRAM).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, a Non-Volatile Memory Express (NVMe) interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, the memory device 120 may be a multi-layer memory device. For example, a managed NAND component or device, such as an eMMC or UFS, may be a package that includes a flash memory controller (e.g., controller 130) and stacked or layered flash memory (e.g., multiple memories 140). In this case, the memory device 120 may be formed on a substrate, with multiple layers of the memory 140 stacked to provide higher levels of memory density than is achieved with only a single layer of memory 140. Each layer of the memory 140, as described in more detail herein, may be referred to as a "memory component" or as a separate "device." Additionally, or alternatively, system 100 may include multiple, layered memory devices 120. In other words, one or more host devices 110 may communicate with multiple stacked memory devices 120 (e.g., each including a controller 130 and a memory 140). In such a case, each memory device 120 may be referred to as a "memory component" or as a separate "device."

Although some implementations are described herein in terms of memory devices, other types of layered devices are contemplated, such as layered devices that include layered processing components, layered logic components, or layered routing components, among other examples. Further, although some implementations are described herein in terms of vertical layering of memory components or other components, other physical arrangements are contemplated, such as horizontal layering of memory components or other components.

As indicated above, FIG. 1 is provided as an example. Other examples may differ from what is described with regard to FIG. 1.

Figure 2:
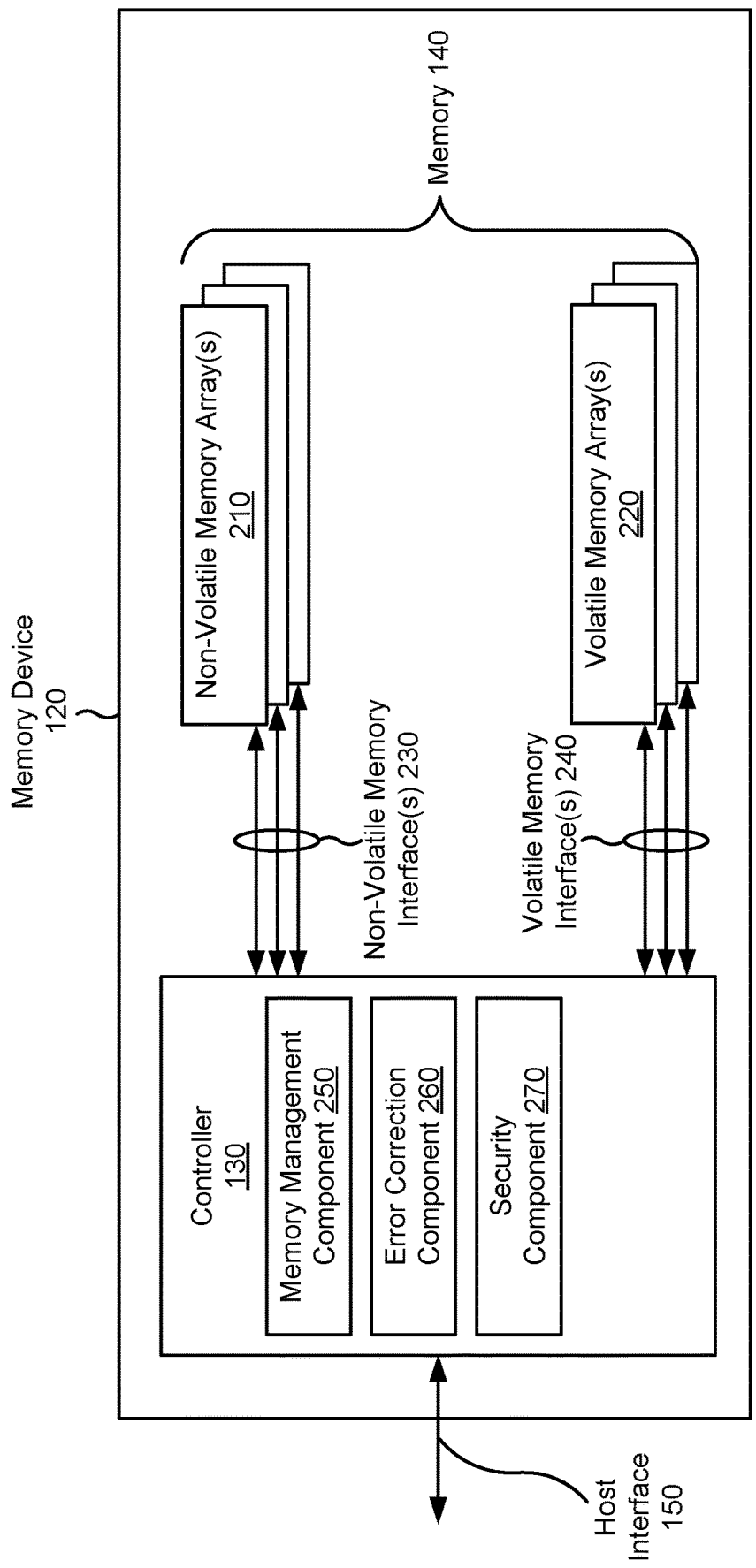
FIG. 2 is a diagram of example components included in a layered device.

FIG. 2 is a diagram of example components included in a layered device, such as the memory device 120 of FIG. 1. As described above in connection with FIG. 1, the memory device 120 may include a controller 130 and memory 140. As shown in FIG. 2, the memory 140 may include one or more non-volatile memory arrays 210, such as one or more NAND memory arrays and/or one or more NOR memory arrays. In some implementations, the non-volatile memory arrays 210 may be stacked or layered memory components. Additionally, or alternatively, the memory 140 may include one or more volatile memory arrays 220, such as one or more SRAM arrays and/or one or more DRAM arrays. In some implementations, the volatile memory arrays 220 may be stacked or layered memory components. The controller 130 may transmit signals to and receive signals from a non-volatile memory array 210 using a non-volatile memory interface 230. The controller 130 may transmit signals to and receive signals from a volatile memory array 220 using a volatile memory interface 240.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 250, an error correction component 260, and/or a security component 270. In some implementations, one or more of these components are implemented as one or more instructions (e.g., firmware)

executed by the controller 130. Alternatively, one or more of these components may be implemented as dedicated integrated circuits distinct from the controller 130.

The memory management component 250 may be configured to manage performance of the memory device 120. For example, the memory management component 250 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 250, such as information regarding memory block age, memory block erase count, and/or error information associated with a memory partition (e.g., a memory cell, a row of memory, a block of memory, or the like).

The error correction component 260 may be configured to detect and/or correct errors associated with the memory device 120. For example, the error correction component 260 may be configured to detect and/or correct an error associated with writing data to or reading data from one or more memory cells of a memory array, such as a single-bit error (SBE) or a multi-bit error (MBE).

The security component 270 may be configured to perform one or more security operations for the memory device 120. For example, the security component 270 may be configured to encrypt or decrypt data, such as data read from the memory 140 and/or data to be written to the memory 140. Additionally, or alternatively, the security component 270 may be configured to validate commands received from the host device 110, such as by validating a cryptographic signature of a command (e.g., using one or more cryptographic keys).

Figure 4A:
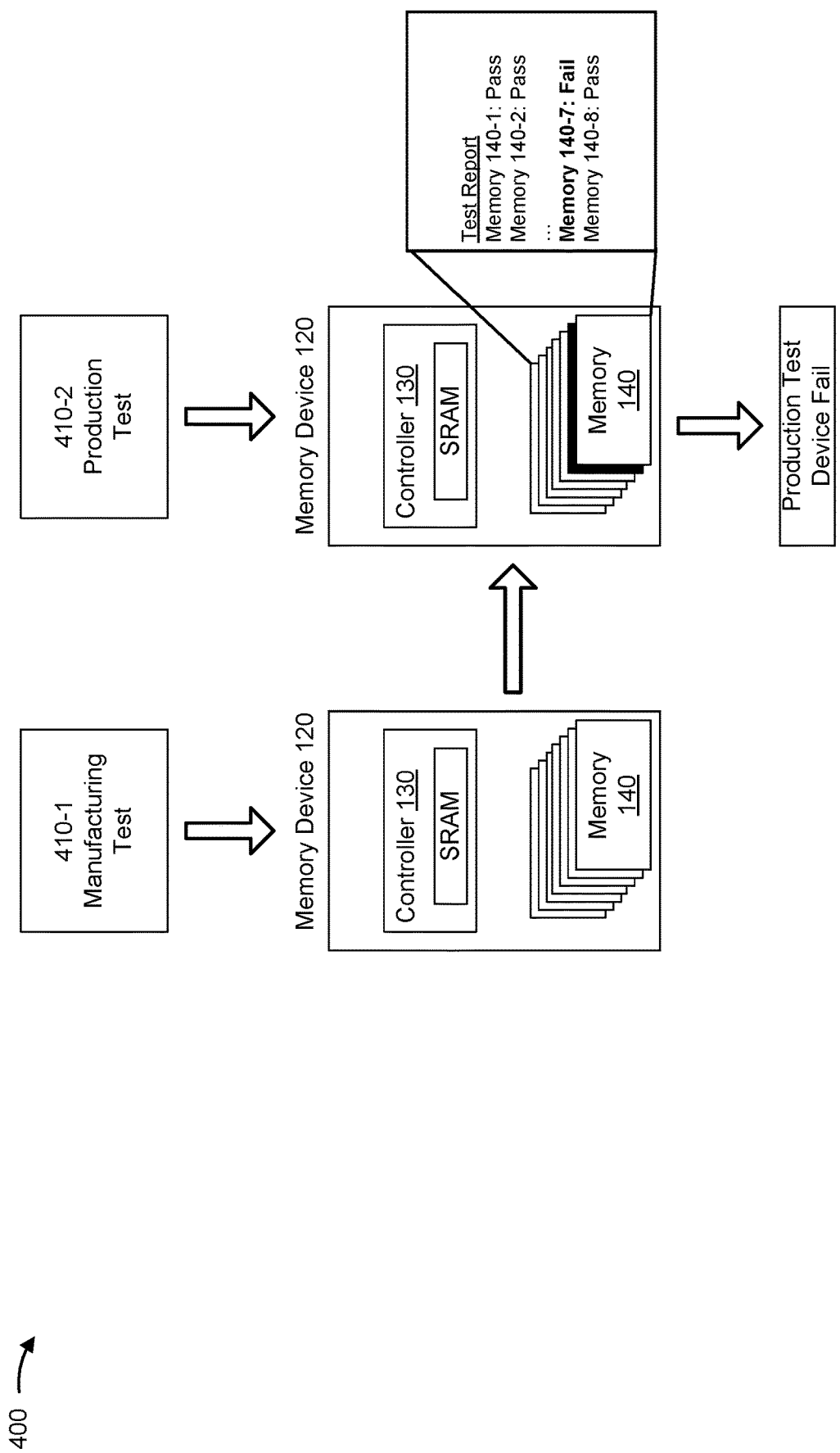
FIGS. 4A-4C are diagrams illustrating an example associated with overprovisioning a layered device.
Figure 4B:
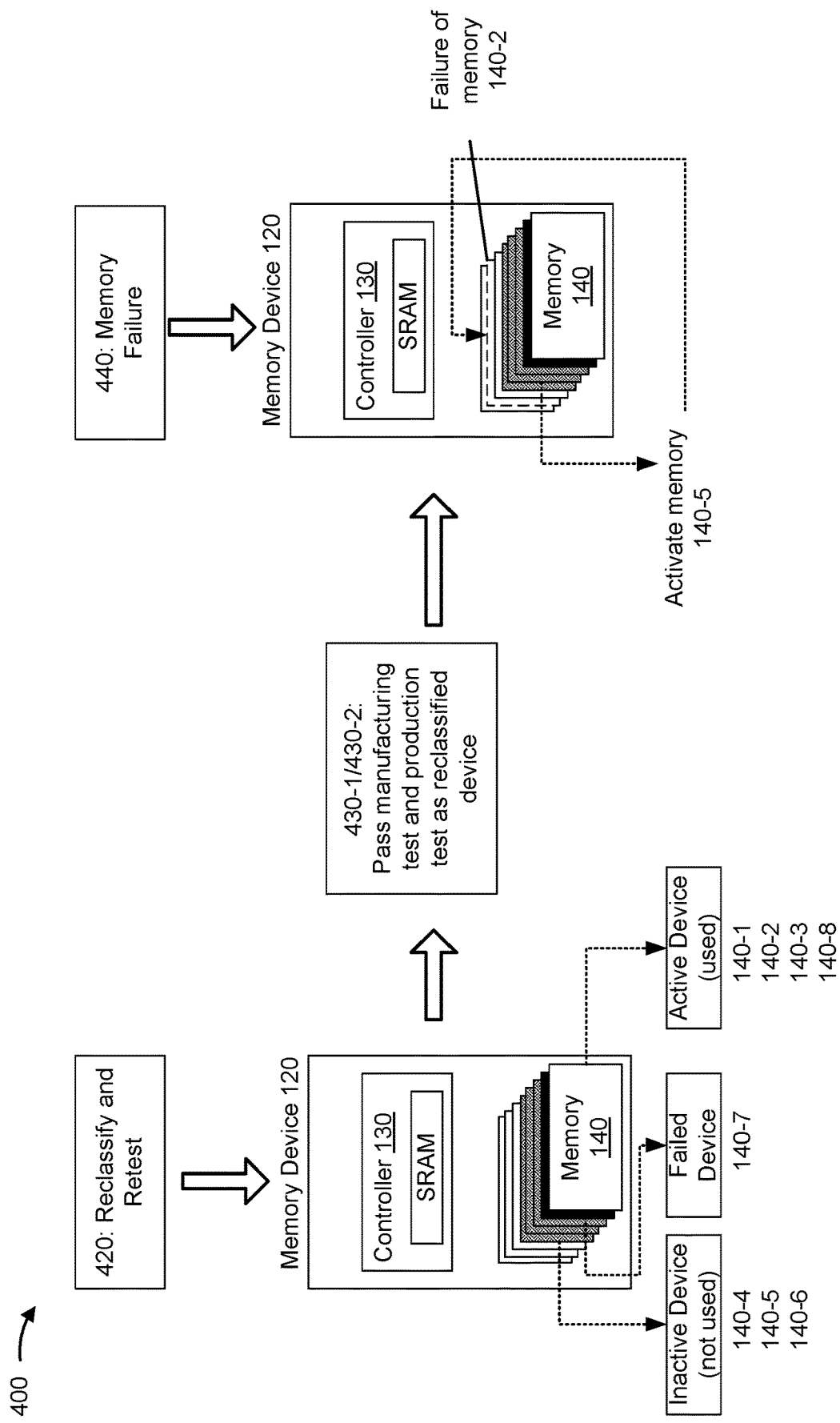
Figure 4C:
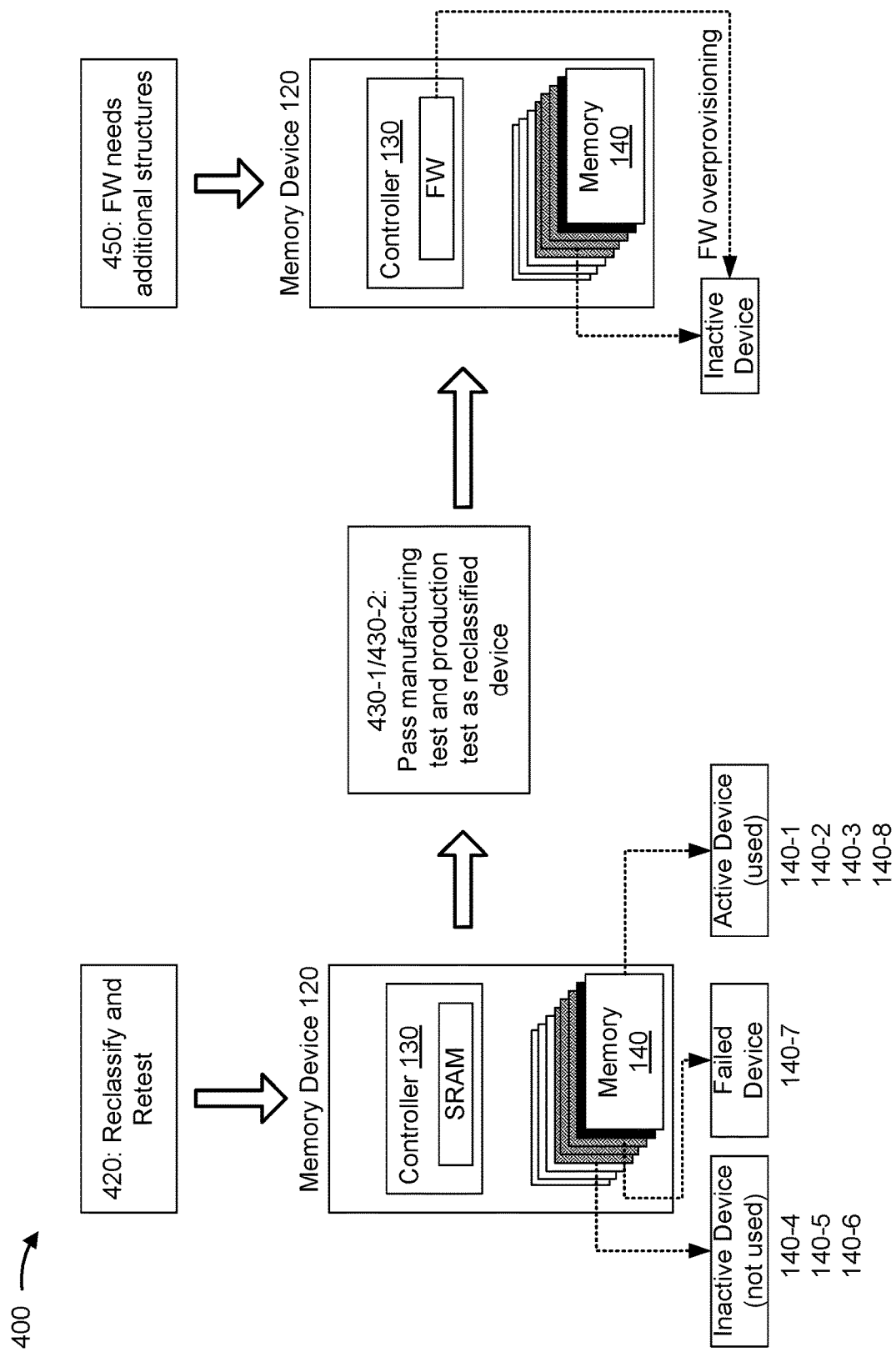
Figure 5:
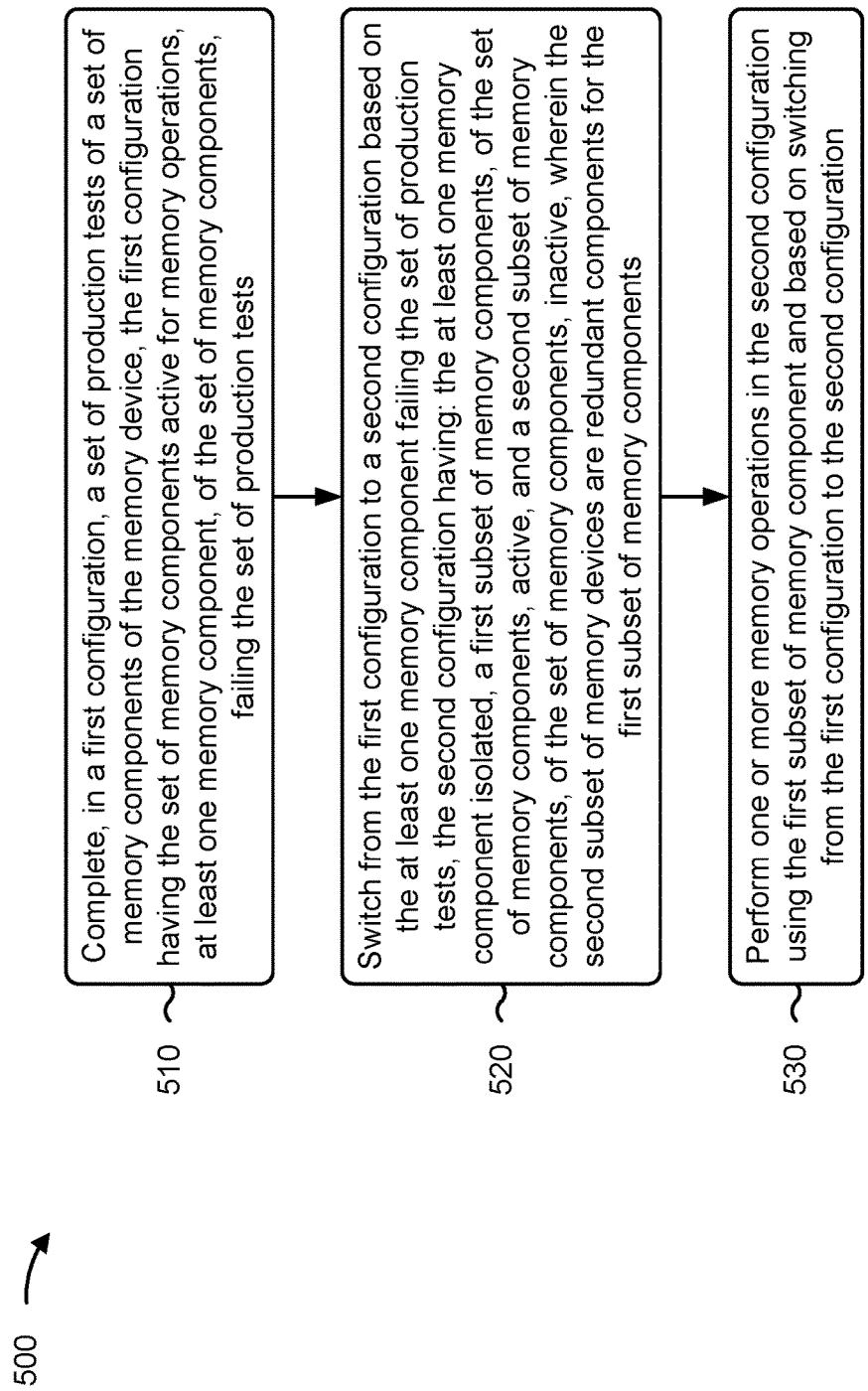
FIG. 5 is a flow chart of an example of overprovisioning a layered device.

One or more devices or components shown in FIG. 2 may be used to carry out operations described elsewhere herein, such as one or more operations of FIGS. 4A-4C and/or one or more process blocks of the methods of FIG. 5. For example, the controller 130 and/or the host interface 150 (e.g., firmware thereof) may perform one or more operations and/or methods relating to component overprovisioning.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
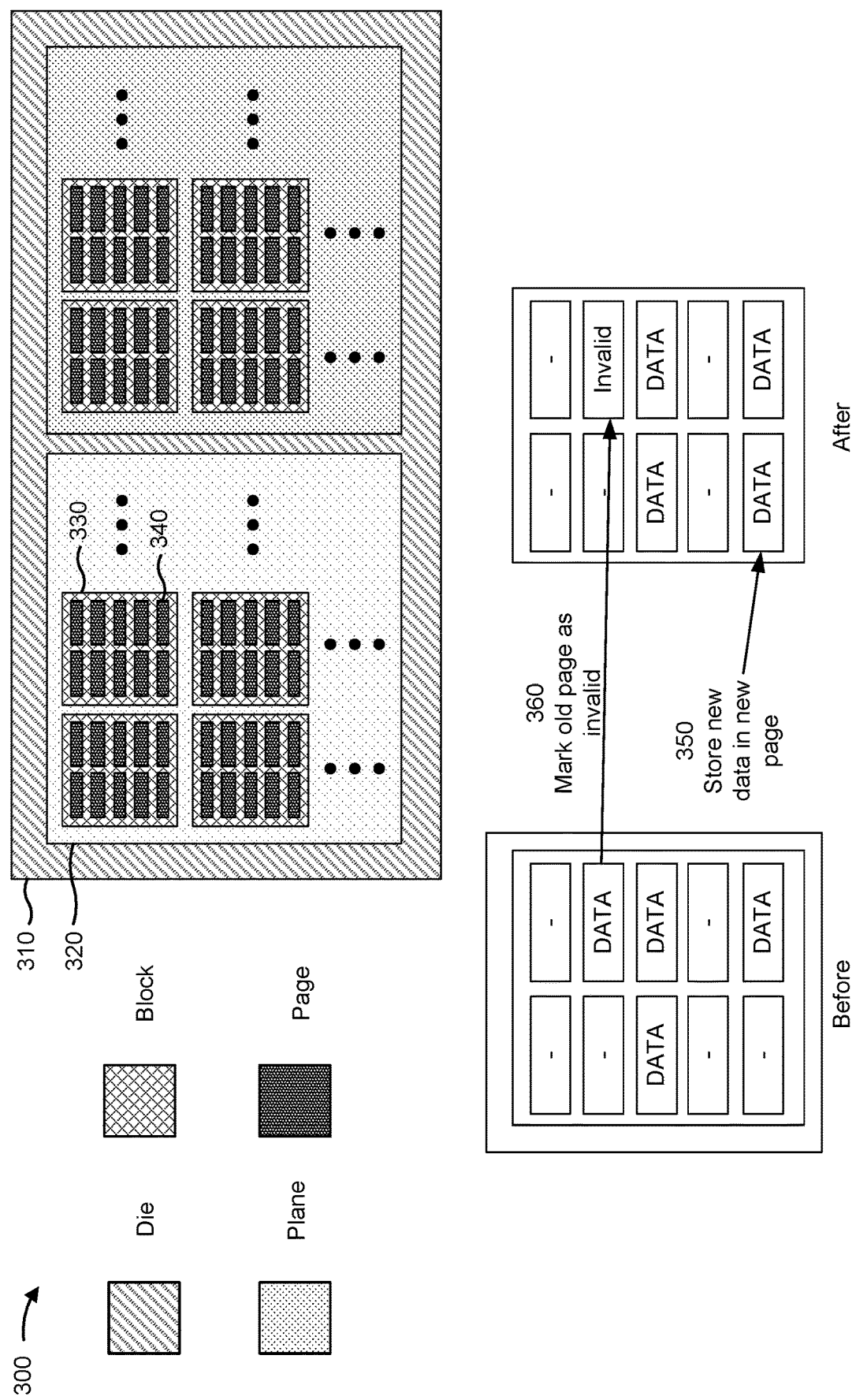
FIG. 3 is a diagram illustrating an example architecture that may be used by a layered device.

FIG. 3 is a diagram illustrating an example architecture, such as a memory architecture 300, that may be used by a layered device, such as the memory device 120 of FIG. 1. The memory device 120 may use the memory architecture 300 to store data. As shown, the memory architecture 300 may include a die 310, which may include multiple planes 320. A plane 320 may include multiple blocks 330. A block 330 may include multiple pages 340. Although FIG. 3 shows a particular quantity of planes 320 per die 310, a particular quantity of blocks 330 per plane 320, and a particular quantity of pages 340 per block 330, these quantities may be different than what is shown. In some implementations, the memory architecture 300 is a NAND memory architecture.

The die 310 is a structure made of semiconductor material, such as silicon. The memory device 120 may be fabricated on the die 310 (e.g., via a semiconductor device fabrication process). In some implementations, a die 310 is the smallest unit of memory that can independently execute commands. A memory chip or package may include one or more dies 310. For example, a memory chip or package may include multiple stacked dies 310 corresponding to multiple stacked memory devices 120. Additionally, or alternatively, a single die 310 may include multiple stacked memory components, as described herein.

Each die 310 of a chip includes one or more planes 320. A plane 320 is sometimes called a memory plane. In some implementations, identical and concurrent operations can be performed on multiple planes 320 (sometimes with restrictions). Each plane 320 includes multiple blocks 330. A block 330 is sometimes called a memory block. Each block 330 includes multiple pages 340. A page 340 is sometimes called a memory page. A block 330 is the smallest unit of memory that can be erased. In other words, an individual page 340 of a block 330 cannot be erased without erasing every other page 340 of the block 330. A page 340 is the smallest unit of memory to which data can be written (i.e., the smallest unit of memory that can be programmed with data) and from which data can be read. The terminology "programming" memory and "writing to" memory may be used interchangeably. A page 340 may include multiple memory cells that are accessible via the same access line (sometimes called a word line).

In some implementations, read and write operations are performed for a specific page 340, while erase operations are performed for a block 330 (e.g., all pages 340 in the block 330). In some implementations, to prevent wearing out of memory, all pages 340 of a block 330 may be programmed before the block 330 is erased to enable a new program operation to be performed to a page 340 of the block 330. After a page 340 is programmed with data (called "old data" below), that data can be erased, but that data cannot be overwritten with new data prior to being erased. The erase operation would erase all pages 340 in the block 330, and erasing the entire block 330 every time that new data is to replace old data would quickly wear out the memory cells of the block 330. Thus, rather than performing an erase operation, the new data may be stored in a new page (e.g., an empty page), as shown by reference number 350, and the old page that stores the old data may be marked as invalid, as shown by reference number 360. The memory device 120 may then point operations associated with the data to the new page and may track invalid pages to prevent program operations from being performed on invalid pages prior to an erase operation. When the pages 340 of a block 330 are full (e.g., all or some threshold quantity of pages are either invalid or store valid data), the memory device 120 may copy the valid data (e.g., to a new block or to the same block after erasure) and may erase the block 330.

As indicated above, FIG. 3 is provided as an example. Other examples may differ from what is described with regard to FIG. 3.

FIGS. 4A-4C are diagrams illustrating an example 400 of component overprovisioning in layered devices.

As shown in FIG. 4A, a memory device 120 may include a controller 130 (e.g., with a static random access memory (SRAM) component) and a set of memories 140 (e.g., dynamic random access memory (DRAM) components). The memory device 120 may be subject to a set of quality tests to determine whether the memory device 120 is suitable for usage (e.g., to avoid shipping of defective components or components with greater than a threshold likelihood of failure within a particular period of time). As further shown in FIG. 4A, the memory device 120 may pass a first set of tests (e.g., one or more manufacturing tests 410-1) performed by a testing device (not shown) and may fail a second set of tests (e.g., one or more production tests 410-2) performed by the testing device. As described above, typically, failure of any memory component of the memory device 120 (e.g., a failure of memory 140-7, as shown) would result in the memory device 120 being classified as not suitable for usage. In this case, for example, a single memory component (e.g., a single memory 140-7) may fail the set of production tests, but other memory components (e.g., memory components 140-1 through 140-6 and memory component 140-8 may be successful in passing the set of production tests).

As shown in FIG. 4B, and by reference number 420, rather than classifying memory device 120 as not suitable for usage, the test device (not shown) may reclassify and retest memory device 120 in a different configuration. For example, in the first configuration shown in FIG. 4A, the memory device 120 included 8 active memories (e.g., memories 140-1 through 140-8). If, for example, each memory 140 provides 8 gigabytes (GB) of memory, then the first configuration of memory device 120 is configured as a 128 GB device. In this case, memory device 120 may be reclassified to a second configuration that includes, as shown in FIG. 4B, a first subset of the memories (e.g., memories 140-1, 140-2, 140-3, and 140-8) that are active devices, a second subset of memories (e.g., memory 140-7) that is a failed device, and a third subset of memories (e.g., memories 140-4, 140-5, and 140-6) that are inactive devices. In this way, the memory device 120 reduces a memory density (e.g., the second configuration has a smaller memory density than to the first configuration), but enables use of the memory device 120 despite a failure of a memory component therein, thereby reducing issues with chip wastage and chip shortage.

In some implementations, to deactivate one or more components (e.g., the failed memory 140-7 or the other memories 140-4, 140-5, and 140-6), the memory device 120 may reconfigure or switch from the first configuration to the second configuration. For example, the memory device 120 may have firmware altered (e.g., by removing and replacing the firmware with new firmware, by switching from a first firmware configuration to a second firmware configuration, by selecting a different configuration within the firmware, or by altering existing firmware) to cause one or more components to be removed from usage by the memory device 120. In this way, the memory device 120 may isolate or exclude the failed memory 140-7 and/or the redundant memories 140-4, 140-5, and 140-6. In some implementations, the controller 130 selects stored firmware corresponding to the second configuration and loads the selected firmware into, for example, the SRAM to switch the memory device 120 to the second configuration. In this way, the memory device 120 becomes configured to operate as if the failed memory 140-7 is not present in the memory device 120. Similarly, the memory device 120 may be configured to operate as if the inactive memories 140-4, 140-5, and 140-6 are not present in the memory device 120 (unless used for redundancy to replace a subsequent failed component or for usage as an additional structure, as described in more detail herein).

In one example, to deactivate one or more memory components, the memory device 120 may remove memory addresses associated with the one or more memory components from an address space. In another example, to deactivate the one or more memory components, the memory device 120 may remove information identifying the one or more memory components from information that is to be provided, external to memory device 120, to enable other devices (e.g., host device 110 and system 100) to interact with memories 140 of the memory device 120. In this case, memory device 120 may provide information identifying only memories 140-1, 140-2, 140-3, and 140-8 externally, but may be aware of memories 140-4, 140-5, and 140-6 internally (e.g., for use in redundancy and component over-provisioning, as described in more details herein).

In some implementations, the memory device 120 may switch from the first configuration to the second configuration based on the quantity of failed memories not satisfying a threshold. For example, the memory device 120 may switch to the second configuration when no more than 2 out of 8 memory components fail production testing. Additionally, or alternatively, the memory device 120 may switch to the second configuration when no more than 3 out of 8 memory components fail production testing. In some implementations, multiple possible second configurations may be available. For example, for a memory device 120 including 16 memory components, the memory device 120 may switch from having 16 memory components to having 8 active memory components, 4 active memory components, or 2 active memory components. In some implementations, the memory device 120 may select from the multiple possible second configurations based on a quantity of failed memory components, a use case scenario for the memory device 120, a desired quantity of redundant memory components, or another factor. For example, each quantity of memory components may be a configuration tier, and the memory device 120 may select a highest configuration tier that the memory device 120 can satisfy (e.g., by having a minimum quantity of memory components for a requirement of the selected configuration tier). In other words, if the memory device 120 has 1 failed memory component of 16 memory components, the memory device 120 may select the 8 active memory components configuration tier, but if the memory device 120 has 9 failed memory components of 16 memory components, the memory device may select the 4 active memory components configuration tier.

Returning to the above example, with the first configuration of the memory device 120 being as a 128 GB device, the second configuration of memory device 120 is configured as a 64 GB device. In this case, deactivating memories 140-4, 140-5, and 140-6 may be desirable to cause the memory device 120 to match a particular tier or class of memory device. In other words, if memory devices are provided in tiers or classes of 1 memory component (8 GB), 2 memory components (16 GB), 4 memory components (32 GB), 8 memory components (64 GB), 16 memory components (128 GB), 32 memory components (256 GB), etc. it may be desirable to provide memory device as a 64 GB device (e.g., with the failed memory 140 deactivated and with 3 working memories 140 deactivated) rather than as, for example, a 120 GB device (e.g., with only the failed memory 140 deactivated). For example, providing the memory device 120 in a specified tier may enable reuse of firmware configured for the specified tier and compatibility with host devices 110 and systems 100 configured for the specified tier.

As further shown in FIG. 4B, and by reference numbers 430-1 and 430-2, memory device 120 may be subject to and pass another set of tests (e.g., the test device may identify a success on a set of manufacturing tests and a set of production tests for each active memory component) as a reclassified device. For example, the test device may test memory device 120 in the second configuration to ensure that the memory device 120 is suitable for usage. In this case, based on reconfiguring memory device 120 from the first configuration to the second configuration (e.g., which omits the failed device 140-7 from testing), the memory device 120 can pass the tests and be classified as suitable for usage (in the second configuration). In some implementations, the memory device 120 may be provisioned (e.g., provided with information or otherwise certified) for usage in the second configuration based on passing the set of tests. By reclassifying memory device 120 in firmware, as described above, memory device 120, in the second configuration, can be subject to the same production tests as when in the first configuration, thereby avoiding a need for designing specialized production tests to account for reclassified devices. In other words, from the perspective of the test device, the memory device 120 is, with regard to the example above, a 64 GB memory device similar to other purpose-built 64 GB memory devices.

As further shown in FIG. 4B, and by reference number 440, the memory device 120 may, during a lifetime of memory device 120, experience a failure of an active memory component. For example, controller 130 (or host device 110 or another device) may detect a failure of memory 140-2 during a lifetime of memory device 120. In some implementations, controller 130 may detect a failure of a memory 140 in connection with a memory operation. For example, after deployment, the memory device 120 may perform a set of memory operations with the active memories 140 and may, during performance of the set of memory operations, detect an error in performance of the set of memory operations. In this case, memory device 120 (e.g., controller 130 or host device 110 or another device) may receive (e.g., from firmware) a request for a memory component to be activated and may cause an inactive device to become activated to fulfill the request. For example, memory device 120 may activate redundant memory 140-5 to replace the failed memory 140-2. In this way, the set of inactive devices (e.g., memories 140-4, 140-5, and 140-6, as described above) can provide redundancy in the memory device 120 for the set of activated devices. In this way, layered devices with a failure of a layer can be reused with additional redundancy for improved lifetime and durability rather than be scrapped as unsuitable for usage.

As shown in FIG. 4C, and by reference number 450, during operation, the firmware of memory device 120 may determine that an additional structure is needed for a memory operation. In this case, the firmware may include an algorithm to activate and/or otherwise utilize one or more of the inactive devices (e.g., memories 140-4, 140-5, and 140-6, as described above) as the additional structures for the memory operations. As an example, the firmware and controller 130 may use an inactive device for one or more background processes or operations, such as for temporary storage of data or defragmentation of other memories 140, among other examples. In this case, controller 130 may actively use the inactive devices for operations within the memory device 120, but may not identify the inactive devices as a memory space for storage by host device 110 or system 100. Additionally, or alternatively, the firmware and controller 130 may select an inactive memory 140 as additional overprovisioning (e.g., to fulfill a task of the memory device 120, such as a data storage task or a data recall task, among other examples) for background operations without including the inactive memory 140 in a total device size. In this case, a device size of the memory device 120 (e.g., that can be reported to host device 110 as available for usage) is based on active memories 140 and not inactive memories 140. In this case, the firmware and controller 130 may utilize an inactive memory 140 for the aforementioned additional overprovisioning even when an active memory 140 has not failed, as described above. In this way, a presence of the inactive devices can enhance performance of memory device 120, in the second configuration, relative to other devices that are purpose-built in the second configuration. In other words, a memory device 120 with 4 active memory components and 3 inactive memory components operating as additional structures for internal memory operations may achieve higher levels of performance than another memory device with only 4 active memory components, while also being usable in use cases requiring or specifically configured for memory devices with only 4 active memory components.

As indicated above, FIGS. 4A-4C are provided as an example. Other examples may differ from what is described with regard to FIGS. 4A-4C.

FIG. 5 is a flowchart of an example method 500 associated with component overprovisioning in layered devices. In some implementations, a memory device (e.g., memory device 120) may perform or may be configured to perform one or more process blocks of FIG. 5. In some implementations, another device or a group of devices separate from or including the memory device (e.g., a host device 110, a system 100, or a test device, among other examples) may perform or may be configured to perform one or more process blocks of FIG. 5. Additionally, or alternatively, one or more components of the memory device (e.g., controller 130 or memory 140) may perform or may be configured to perform one or more process blocks of FIG. 5.

As shown in FIG. 5, the method 500 may include completing, in a first configuration, a set of production tests of a set of memory components of the memory device, the first configuration having the set of memory components active for memory operations, at least one memory component, of the set of memory components, failing the set of production tests (block 510). As further shown in FIG. 5, the method 500 may include switching from the first configuration to a second configuration based on the at least one memory component failing the set of production tests, the second configuration having: the at least one memory component isolated, a first subset of memory components, of the set of memory components, active, and a second subset of memory components, of the set of memory components, inactive, wherein the second subset of memory devices are redundant components for the first subset of memory components (block 520). As further shown in FIG. 5, the method 500 may include performing one or more memory operations in the second configuration using the first subset of memory component and based on switching from the first configuration to the second configuration (block 530).

Although FIG. 5 shows example blocks of a method 500, in some implementations, the method 500 may include additional blocks, fewer blocks, different blocks, or differently arranged blocks than those depicted in FIG. 5. Additionally, or alternatively, two or more of the blocks of the method 500 may be performed in parallel. The method 500 is an example of one method that may be performed by one or more devices described herein. These one or more devices may perform or may be configured to perform one or more other methods based on operations described herein, such as the operations described in connection with FIGS. 4A-4C.

In some implementations, a test device includes one or more components configured to: perform, on a set of memory components of a memory device, a set of production tests; identify, based on the set of production tests, a failure of a memory component of the memory device; and reconfigure the memory device to downsize the memory device from a first configuration associated with the set of memory components to a second configuration associated with a first subset of the set of memory components, wherein the first subset of the set of memory components includes one or more active memory components, a second subset of the set of memory components includes the failed memory component, and a third subset of the set of memory components includes one or more redundant memory components.

In some implementations, a method performed by a memory device includes completing, in a first configuration, a set of production tests of a set of memory components of the memory device, the first configuration having the set of memory components active for memory operations, at least one memory component, of the set of memory components, failing the set of production tests; switching from the first configuration to a second configuration based on the at least one memory component failing the set of production tests, the second configuration having: the at least one memory component isolated, a first subset of memory components, of the set of memory components, active, and a second subset of memory components, of the set of memory components, inactive, wherein the second subset of memory devices are redundant components for the first subset of memory components; and performing one or more memory operations in the second configuration using the first subset of memory component and based on switching from the first configuration to the second configuration.

In some implementations, a system includes a test device configured to: perform, on a set of memory components of a memory device, a set of production tests; identify, based on the set of production tests, a failure of a memory component of the memory device; reconfigure the memory device to downsize the memory device from a first configuration associated with the set of memory components to a second configuration associated with a first subset of the set of memory components, wherein the first subset of the set of memory components includes one or more active memory components, a second subset of the set of memory components includes the failed memory component, and a third subset of the set of memory components includes one or more redundant memory components; and sort the memory device into a group of memory devices associated with the second configuration.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A test device, comprising:
   one or more components configured to:
      perform, on a set of memory components of a memory device, a set of production tests;
      identify, based on the set of production tests, a failure of a memory component of the memory device; and
      reconfigure the memory device to downsize the memory device from a first configuration associated with the set of memory components to a second configuration associated with a first subset of memory components in the set of memory components, a second subset of memory components in the set of memory components, and a third subset of memory components in the set of memory components, wherein:
         the first subset of memory components includes one or more active memory components;
         a memory density associated with the second configuration is based on the first subset of memory components;
         the second subset of memory components includes the failed memory component;
         the third subset of memory components includes one or more redundant memory components; and
         the first subset of memory components, the second subset of memory components, and the third subset of memory components are different.

2. The test device of claim 1, wherein the one or more components are further configured to:
   perform, on the first subset of memory components of the memory device, another set of production tests;
   identify, based on the other set of production tests, a success for the memory device; and provision the memory device in the second configuration based on identifying the success for the memory device.

3. The test device of claim 1, wherein the one or more components are further configured to:
adjust a firmware configuration of the memory device from the first configuration to the second configuration.

4. The test device of claim 1, wherein the one or more components are further configured to:
configure the third subset of memory components as redundant for the first subset of memory components.

5. The test device of claim 1, wherein the first configuration is associated with a first memory density for the memory device and the memory density associated with the second configuration is a second memory density for the memory device.

6. The test device of claim 5, wherein the second memory density is smaller than the first memory density.

7. The test device of claim 1, wherein the one or more components are further configured to:
exclude the second subset of memory components from use by the memory device.

8. The test device of claim 1, wherein the one or more components are further configured to:
reconfigure the memory device based on a quantity of memory components passing the set of production tests satisfying a threshold.

9. The test device of claim 1, wherein the one or more components are further configured to:
select the second configuration, from a plurality of possible second configurations, based on a first quantity of passed memory components or a second quantity of failed memory components, where each of the plurality of possible second configurations corresponds to a different first quantity or second quantity; and
reconfigure the memory device using the selected second configuration.

10. A method performed by a memory device, comprising:
completing, in a first configuration, a set of production tests of a set of memory components of the memory device, the first configuration having the set of memory components active for memory operations,
at least one memory component, of the set of memory components, failing the set of production tests;
switching from the first configuration to a second configuration based on the at least one memory component failing the set of production tests, the second configuration associated with a first subset of memory components, of the set of memory components, wherein:
the at least one memory component is isolated,
the first subset of memory components is configured as active,
a memory density associated with the second configuration is based on the first subset of memory components,
a second subset of memory components, of the set of memory components, is configured as inactive, and
the second subset of memory components includes redundant components for the first subset of memory components; and
performing one or more memory operations in the second configuration using the first subset of memory components and based on switching from the first configuration to the second configuration.

11. The method of claim 10, further comprising:
detecting a failure of a first memory component of the first subset of memory components; and
activating a second memory component, of the second subset of memory components, based on detecting the failure of the first memory component.

12. The method of claim 11, further comprising:
isolating the first memory component based on detecting the failure of the first memory component and activating the second memory component.

13. The method of claim 10, further comprising:
receiving, from firmware associated with the memory device, a request for another active memory component; and
activating a memory component, of the second subset of memory components, to fulfill the request for another active memory component.

14. The method of claim 10, further comprising:
identifying a set of configuration tiers, wherein each configuration tier, of the set of configuration tiers, has a requirement of a minimum quantity of memory components;
identifying a highest configuration tier, of the set of configuration tiers, for which a quantity of memory components, of the set of memory components, that passed the set of production tests satisfies a corresponding requirement of the minimum quantity of memory components; and
switching to the second configuration based on the second configuration being the highest configuration tier for which the quantity of memory components satisfies the corresponding requirement of the minimum quantity of memory components.

15. The method of claim 10, further comprising:
receiving a command to identify a configuration of the memory device; and
outputting information identifying the second configuration as a response to the command.

16. The method of claim 10, further comprising:
using a memory component, of the second subset of memory components, to fulfill a task associated with the memory device.

17. The method of claim 10, further comprising:
receiving a command to perform a memory operation using the at least one memory component; and
rejecting performance of the memory operation using the at least one memory component.

18. The method of claim 10, further comprising:
receiving a command to perform a memory operation using the at least one memory component; and
performing the memory operation using another memory component of the set of memory components to fulfill the command.

19. A system, comprising:
a test device configured to:
perform, on a set of memory components of a memory device, a set of production tests;
identify, based on the set of production tests, a failure of a memory component of the memory device;
reconfigure the memory device to downsize the memory device from a first configuration associated with the set of memory components to a second configuration associated with a first subset of memory components in the set of memory components, a second subset of memory components in the set of memory components, and a third subset of memory components in the set of memory components, wherein:
the first subset of memory components includes one or more active memory components;
a memory density associated with the second configuration is based on the first subset of memory components;
the second subset of memory components includes the failed memory component;
the third subset of memory components includes one or more redundant memory components; and
the first subset of memory components, the second subset of memory components, and the third subset of memory components are different; and
sort the memory device into a group of memory devices associated with the second configuration.

20. The system of claim 19, wherein the test device is further configured to:
select the group of memory devices, from a plurality of possible groups of memory devices associated with a plurality of possible configurations, based on reconfiguring the memory device to the second configuration.

21. The system of claim 19, wherein the test device is further configured to:
perform, on the first subset of memory components, another set of production tests;
identify a failure of another memory component of the first subset of memory components; and
reconfigure the memory device to a third configuration that includes the other memory component in the second subset of memory components.

22. The system of claim 19, wherein the test device is further configured to:
switch from a first firmware configuration of the memory device to a second firmware configuration of the memory device, the first firmware configuration and the second firmware configuration being loaded to the memory device before the set of production tests.

23. The system of claim 19, wherein the test device is further configured to:
remove a first firmware configuration from the memory device and add a second firmware configuration to the memory device.

24. The system of claim 19, wherein the first configuration is associated with a first memory density for the memory device and the memory density associated with the second configuration is a second memory density for the memory device.

25. The system of claim 24, wherein the second memory density is smaller than the first memory density.

\* \* \* \* \*